(12) United States Patent
Zhang et al.

(10) Patent No.: US 9,978,641 B2
(45) Date of Patent: May 22, 2018

(54) SEMICONDUCTOR STRUCTURE AND FABRICATION METHOD THEREOF

(71) Applicant: Semiconductor Manufacturing International (Shanghai) Corporation, Shanghai (CN)

(72) Inventors: Chenglong Zhang, Shanghai (CN); Haiyang Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days. days.

(21) Appl. No.: 15/059,501

(22) Filed: Mar. 3, 2016

(65) Prior Publication Data

US 2016/0284594 A1    Sep. 29, 2016

(30) Foreign Application Priority Data

Mar. 26, 2015    (CN) .......................... 2015 1 0136849

(51) Int. Cl.
*H01L 21/768* (2006.01)
*H01L 21/8234* (2006.01)
(Continued)

(52) U.S. Cl.
CPC .... *H01L 21/76897* (2013.01); *H01L 21/0276* (2013.01); *H01L 21/0335* (2013.01); *H01L 21/0337* (2013.01); *H01L 21/31144* (2013.01); *H01L 21/76805* (2013.01); *H01L 21/76819* (2013.01); *H01L 21/76829* (2013.01); *H01L 21/823431* (2013.01); *H01L 21/823468* (2013.01); *H01L 21/823475* (2013.01); *H01L 23/535* (2013.01); *H01L 23/53214* (2013.01); *H01L 23/53228* (2013.01);
(Continued)

(58) Field of Classification Search
CPC ........... H01L 29/66545; H01L 21/3141; H01L 27/0886; H01L 21/76816; H01L 21/76897; H01L 21/31144; H01L 21/0337; H01L 21/76805
USPC ....................................................... 438/587
See application file for complete search history.

(56) References Cited

U.S. PATENT DOCUMENTS 9,153,498 B2 * 10/2015 Xie ..................... H01L 29/6653
9,202,699 B2 * 12/2015 Rosenbaum ...... H01L 29/66545
(Continued)

*Primary Examiner* — Marcos D Pizarro
*Assistant Examiner* — Antonio Crite
(74) *Attorney, Agent, or Firm* — Anova Law Group, PLLC

(57) ABSTRACT

A method for forming a semiconductor structure includes providing a semiconductor substrate; forming a plurality of fins on the semiconductor substrate; forming a plurality of gate structures on the plurality of fins and sidewall spacers on side surfaces of the gate structures; forming a first dielectric layer on the semiconductor substrate; recessing the gate structures to form a plurality of trenches on top surfaces of the gate structures; forming a mask material layer filling the trenches and on the first dielectric layer; forming a protective layer on the top surfaces of the remaining gate structures and a mask layer on a portion of the first dielectric layer between adjacent gate structures by etching the mask material layer; forming contact through-holes in the first dielectric layer between adjacent gates structure at both sides of the mask layer; and forming a metal contact via in each of the contact through-holes.

19 Claims, 13 Drawing Sheets

(51) Int. Cl.
    *H01L 27/088*    (2006.01)
    *H01L 23/535*    (2006.01)
    *H01L 23/532*    (2006.01)
    *H01L 21/027*    (2006.01)
    *H01L 21/033*    (2006.01)
    *H01L 21/311*    (2006.01)

(52) U.S. Cl.
    CPC .. *H01L 23/53242* (2013.01); *H01L 23/53257* (2013.01); *H01L 27/0886* (2013.01)

(56) References Cited

U.S. PATENT DOCUMENTS

| | | | |
|---|---|---|---|
| 9,224,842 B2* | 12/2015 | Bouche | H01L 29/785 |
| 9,293,576 B2* | 3/2016 | Cheng | H01L 29/7813 |
| 9,349,812 B2* | 5/2016 | Chen | H01L 21/76897 |
| 2008/0076244 A1* | 3/2008 | Ye | H01L 21/31144 |
| | | | 438/597 |
| 2012/0142179 A1* | 6/2012 | Park | H01L 21/0337 |
| | | | 438/586 |
| 2014/0264487 A1* | 9/2014 | Pham | H01L 29/78 |
| | | | 257/288 |
| 2015/0129961 A1* | 5/2015 | Li | H01L 29/40 |
| | | | 257/347 |
| 2016/0225762 A1* | 8/2016 | Zang | H01L 27/0886 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201510136849.6, filed on Mar. 26, 2015, the entirety of which is incorporated herein by reference.

FIELD OF THE INVENTION

The present invention generally relates to the field of semiconductor technology and, more particularly, relates to semiconductor structures and fabrication processes thereof.

BACKGROUND

With the continuous development of semiconductor technology, such as incorporating high-k dielectrics in the gate stack, strain engineering, pocket implants and optimization in materials and device structures, etc., the critical dimension of semiconductor devices has become smaller and smaller. However, when the critical dimension of the semiconductor devices is further reduced, the scaling of planar devices is proven to be extremely challenging due to degrading short channel effects, process variations and reliability degradation, etc. Comparing with the planar transistors, Fin field-effect transistors (FinFETs) have fully depleted fins, reduced random dopant fluctuation, improved mobility, lower parasitic junction capacitance and improved area efficiency, etc. Thus, FinFETs have attracted more and more attentions.

During the fabrication of integrated circuits (ICs), after forming semiconductor devices on a substrate, a plurality of metalized layers are formed to connect the semiconductor devices to circuits. The metalized layers include interconnect lines and conductive vias formed in contact through-holes, etc. The conductive vias formed in the contact through-holes are connected with the semiconductor devices; and the interconnect lines are connected with the conductive vias that are connected with the semiconductor devices to form circuits. The contact through-holes include the contact through-holes on surfaces of gate structures and contact through-holes connecting with active regions. With the continuous shrinking of the technical node of the ICs, the distance between adjacent gate structures has become smaller and smaller, especially for FinFETs, it is difficult to directly form contact through-holes on surfaces of the active regions between adjacent gate structures by a direct photolithography and etching process. Thus, a self-aligned contact through-hole (SAC) process has been used to form the contact through-holes connecting with the active regions.

During the fabrication process of the semiconductor structures, it is easy for the size of the contact through-holes formed by the existing SAC process to have differences with the designed value. Thus, the connecting performance of the metal contact vias are affected; and the performance of the semiconductor structure having such metal contact vias is also affected. The disclosed device structures and methods are directed to solve one or more problems set forth above and other problems.

BRIEF SUMMARY OF THE DISCLOSURE

One aspect of the present disclosure includes providing a method for fabricating a semiconductor structure. The method includes providing a semiconductor substrate; and forming a plurality of fins on the semiconductor substrate. The method also includes forming a plurality of gate structures on the plurality of fins and sidewall spacers on side surfaces of the gate structures; and forming a first dielectric layer on the semiconductor substrate. Further, the method includes recessing the gate structure to form a plurality of trenches on top surfaces of the gate structures; and forming a mask material layer filling the trenches on the first dielectric layer. Further, the method also includes forming a protective layer on the top surfaces of the remaining gate structures and a mask layer on a portion of the first dielectric layer between adjacent gate structures by etching the mask material layer; forming contact through-holes in the first dielectric layer between adjacent gate structure at both sides of the mask layer; and forming a metal contact via in each of the contact through-holes.

Another aspect of the present disclosure includes providing a semiconductor structure. The semiconductor structure includes a semiconductor substrate having a plurality of fins and a plurality of gate structures formed on the fins; and a protective layer formed on top surfaces of the gate structures and sidewall spacers formed on side surfaces of the gate structures and the protective layer. The semiconductor structure also includes a first dielectric layer formed on the surface of the semiconductor substrate and covering the fins and the side surfaces of the sidewall spacers; and a mask layer formed on a portion of the first dielectric layer between adjacent gate structures, wherein the mask layer and the protective layer are formed by etching a mask material layer. Further, the semiconductor structure includes a second dielectric layer formed on the first dielectric layer, the protective layer and the sidewall spacers and covering the side surfaces of the mask layer; and metal conductive vias formed in the first dielectric layer between the adjacent gate structures and at both sides of the mask layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 26:
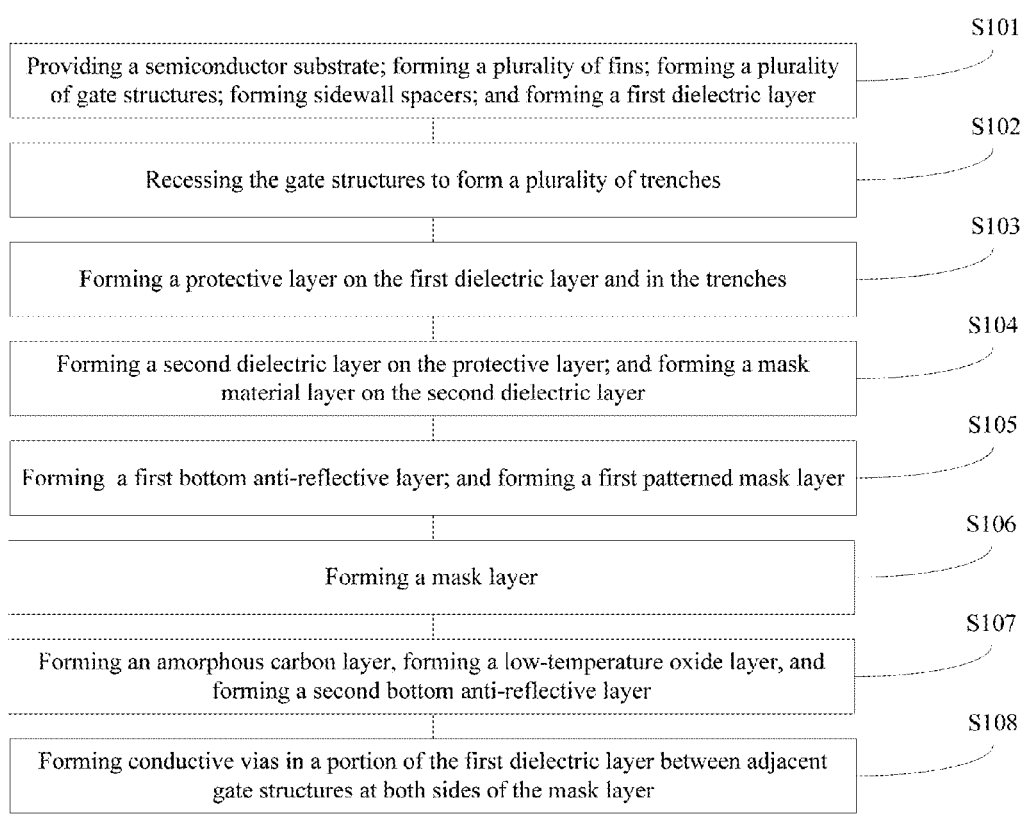
FIG. 26 illustrates an exemplary fabrication process of a semiconductor structure consistent with the disclosed embodiments.

FIG. 26 illustrates an exemplary fabrication process of a semiconductor structure consistent with the disclosed embodiments; and FIG. 1~11 illustrate semiconductor structures corresponding to certain stages of the exemplary fabrication process.

Figure 1:
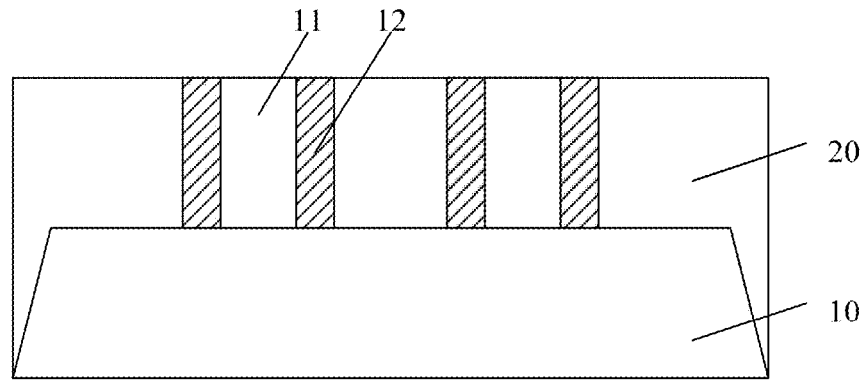
FIGS. 1~11 illustrate semiconductor structures corresponding to certain stages of an exemplary fabrication process of a semiconductor structure consistent with the disclosed embodiments.

As shown in FIG. 26, at the beginning of fabrication process, a semiconductor substrate with certain structures is provided (S101). FIG. 1 illustrates a corresponding semiconductor structure.

As shown in FIG. 1, a semiconductor substrate 10 is provided. A plurality of gate structures 11 may be formed on a surface of the semiconductor substrate 10; and sidewall spacers 12 may be formed on the side surfaces of the gate structures 11.

Further, a first dielectric layer 20 may be formed on the surface of the semiconductor substrate 10. The top surface of the first dielectric layer 20 may level with the top surfaces of the gate structures 11.

Each of the plurality of gate structures 11 may include a gate dielectric layer (not shown) formed on the surface semiconductor substrate 10; and a gate formed on the gate dielectric layer. In one embodiment, the semiconductor substrate 10 may include a base substrate (not labeled) and a plurality of fins (not labeled) formed on a surface of the base substrate. The gate structures 11 may cross the fins; and may cover the top and side surfaces of the fins. FIG. 1 illustrates a cross-sectional view of the semiconductor structure along a longitudinal direction of a fin.

The semiconductor substrate 10 may be made of any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor, or a combination thereof. The semiconductor substrate 100 provides a base for subsequent devices and processes.

The fins may be formed by any appropriate processes. In one embodiment, the fins may be formed by etching a substrate. The etched portions of the substrate may form the fins; and the non-etched portion of the substrate may be referred as the based substrate. Thus, the fins and the base substrate may be made of a same material.

In certain other embodiments, the fins may be formed by growing semiconductor patterns on the base substrate. The patterns may be referred as the fins. Thus, the fins and the base substrate may be made of a same material, or different materials.

The first dielectric layer 20 may be made of any appropriate material, such as silicon oxide, or silicon oxynitride, etc. Various processes may be used to form the first dielectric layer 20, such as a chemical vapor deposition (CVD) process, a physical vapor deposition (PVD) process, an atomic layer deposition (ALD) process, or a flowable CVD (FCVD) process, etc.

Figure 2:
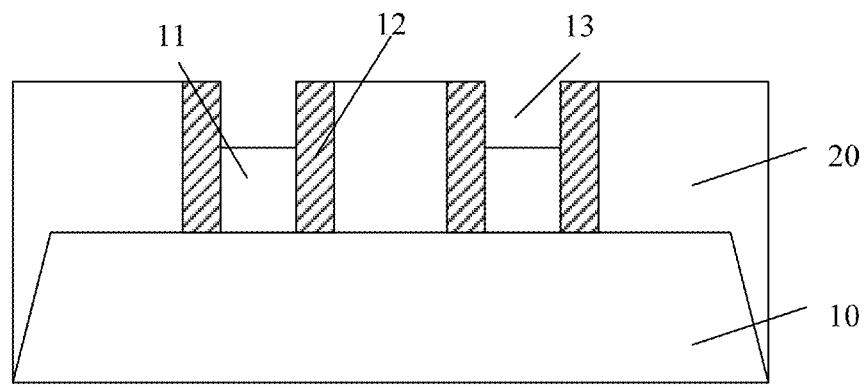

Returning to FIG. 26, after providing the semiconductor substrate 10 and forming the first insulation layer, the gate structures 11 may recessed (S102). FIG. 2 illustrates a corresponding semiconductor structure.

As shown in FIG. 2, the gate structures 11 are recessed with a pre-determined depth; and a trench 13 may be formed on each of the plurality of the remaining gate structures 11. That is, the top portions of the gate structures 11 may be removed; and the top surfaces of the left gate structures 11 may be lower than the top surface of the dielectric layer 20. The gate structures 11 may be recessed by any appropriate process, such as a dry etching process, or a wet etching process, etc.

Figure 3:
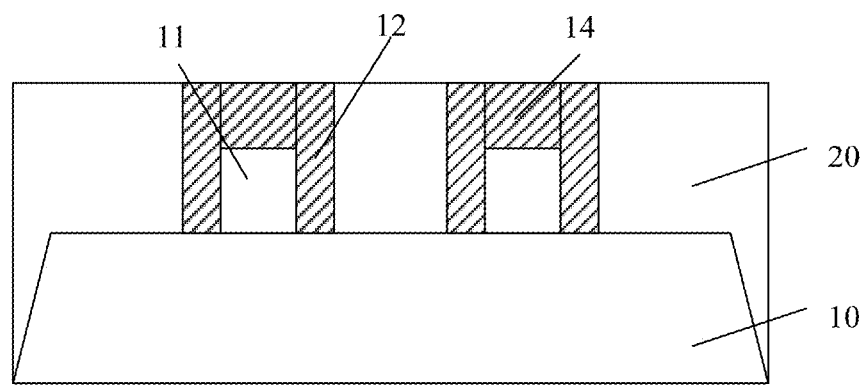

Returning to FIG. 27, after forming the trenches 13, a protective layer may be formed (S103). FIG. 3 illustrates a corresponding semiconductor structure.

As shown in FIG. 3, a protective layer 14 is formed the top surfaces of the remaining gate structures 11. The top surface of the protective layer 14 may level with the top surface of the first dielectric layer 20. The protective layer 14 may be used to protect the remaining gate structures 11 during subsequent processes.

The protective layer 14 may be made of any appropriate material, such as silicon oxide, silicon nitride, or silicon oxynitride, etc. Various processes may be used to form the protective layer 14, such as a CVD process, a PVD process, an ALD process, or an FCVD process, etc.

Figure 4:
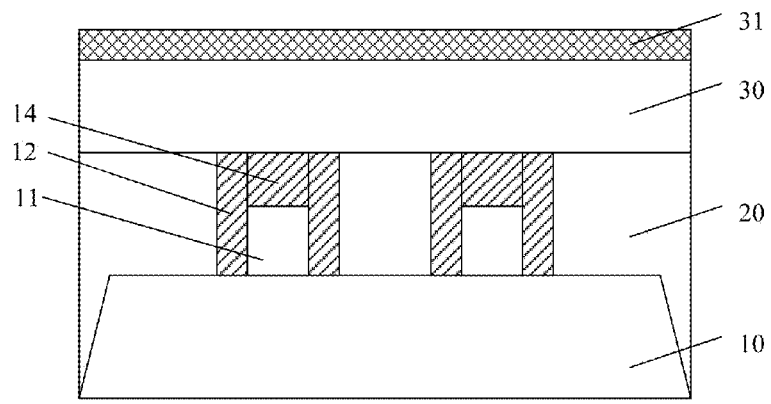

Returning to FIG. 26, after forming the productive layer 14, a second dielectric layer and a mask material layer may be formed (S104). FIG. 4 illustrates a corresponding semiconductor structure.

As shown in FIG. 4, a second dielectric layer 30 is formed. The second dielectric layer 30 may cover the first dielectric layer 20, the sidewall spacers 12 and the protective layer 14.

Further, a mask material layer 31 may be formed on the surface of the second dielectric layer 30. The mask material layer 31 may be used to subsequently form a patterned mask for forming contact through-holes.

The second dielectric layer 30 may be made of any appropriate material, such as silicon oxide, silicon nitride, or silicon oxynitride, etc. Various processes may be used to form the second dielectric layer 30, such as a CVD process, a PVD process, or an ALD process, etc.

The mask material layer 31 may be made of any appropriate material, such as metal material, or metal compound, etc. In one embodiment, the mask material layer 31 is made of TiN.

Figure 5:
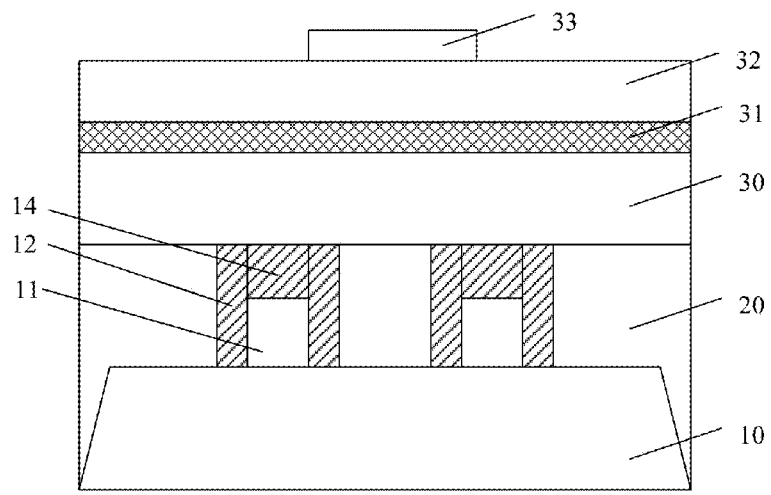
Figure 6:
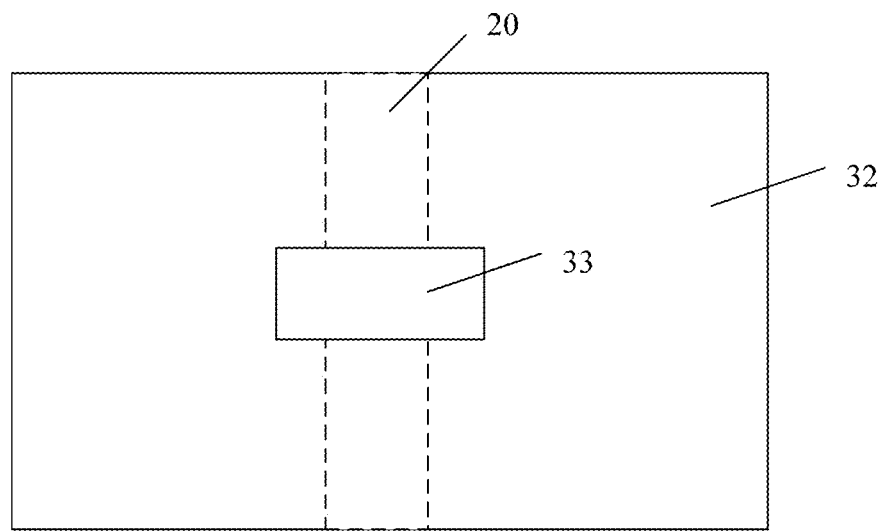

Returning to FIG. 26, after forming the mask material layer 31, a first bottom anti-reflective layer and a first patterned photoresist layer may be formed (S105). FIGS. 5~6 illustrate a corresponding semiconductor structure. FIG. 6 illustrates a top view of the semiconductor structure illustrated in FIG. 5.

As shown in FIGS. 5~6, a first bottom anti-reflective layer 32 is formed on the mask material layer 31; and a first patterned photoresist layer 33 is formed on the first bottom anti-reflective layer 32. The patterns on the first patterned photoresist layer 33 may be corresponding to the patterns subsequently formed in the mask material layer 31. The first patterned photoresist layer 33 may be formed above a portion of the first dielectric layer 20 between adjacent gate structures 13; and the width of the first patterned photoresist layer 33 may be greater than the distance between the adjacent gate structures 13.

The dashed area illustrated in FIG. 6 refers to the portions of the first dielectric layer 20 between the adjacent gate structures 13. The first patterned photoresist layer 33 may cross over the top of the portion of the first dielectric layer 20 between the adjacent gate structures 13.

The first bottom anti-reflective layer 32 may be made of any appropriate material, such as an organic material, or amorphous carbon, etc. Various processes may be used to form the first anti-reflective layer 32, such as a spin-coating process, or a CVD process, etc. The first patterned photoresist layer 33 may be formed by spin-coating a photoresist layer on mask material layer 31; and followed by a standard exposing and developing process.

Figure 7:
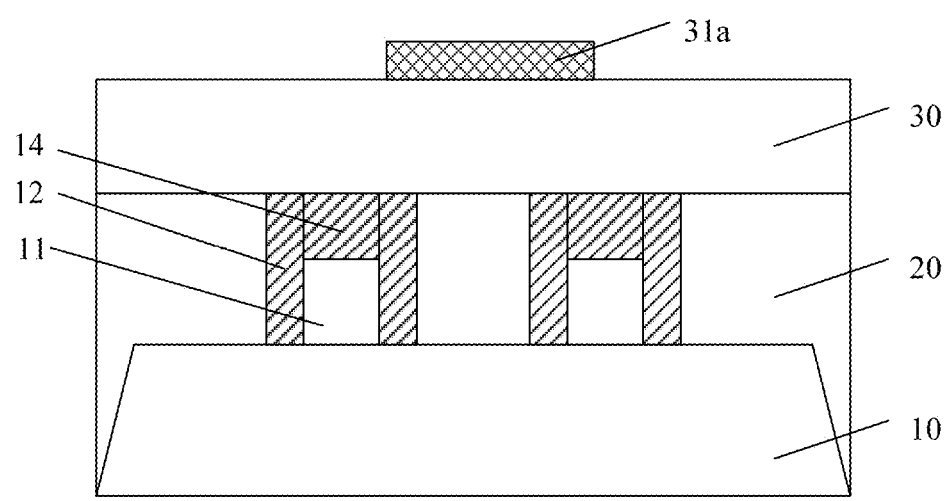

Returning to FIG. 26, after forming the first patterned photoresist layer 33, a mask layer 31a may be formed (S106). FIG. 7 illustrates a corresponding semiconductor structure.

As shown in FIG. 7, a mask layer 31a is formed on the first dielectric layer 30. The mask layer 31a may be formed by etching the first bottom anti-reflective layer 32 and the mask material layer 31 using the first patterned photoresist layer 33 as an etching mask. After forming the mask layer 31a, the first patterned photoresist layer 33 and the first bottom anti-reflective layer 32 may be removed.

The mask material layer 31 may be etched by any appropriate process, such as a dry etching process, or a wet etching process. The first patterned photoresist layer 33 and the first bottom anti-reflective layer 32 may be removed by any appropriate process, such as a dry etching process, a wet etching process, or a plasma ashing process, etc.

Figure 8:
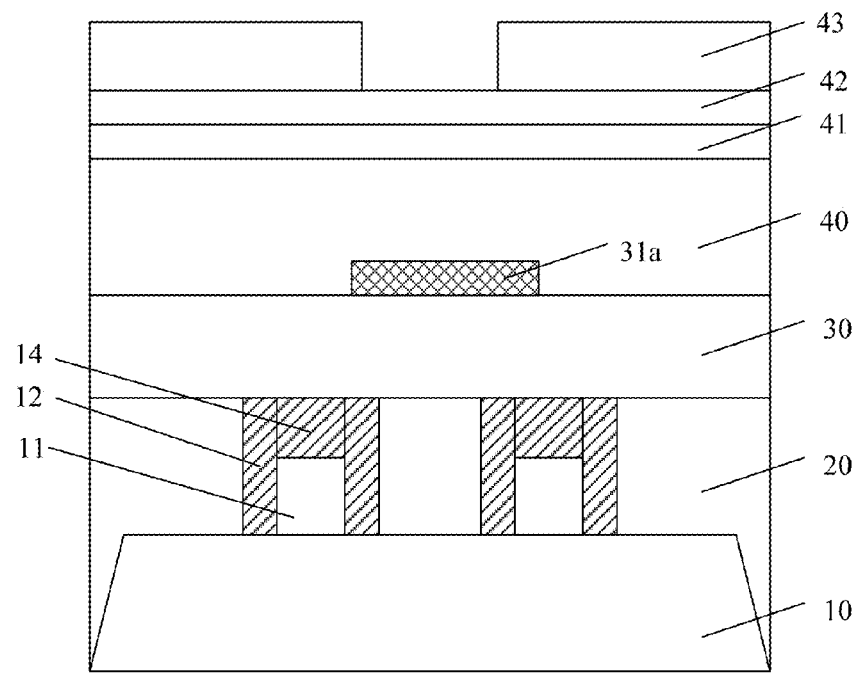

Returning to FIG. 26, after forming the mask layer 31a, an amorphous carbon layer, a low-temperature oxide layer, a second bottom anti-reflective layer and a second patterned photoresist layer may be formed (S107). FIG. 8 illustrates a corresponding semiconductor structure.

As shown in FIG. 8, an amorphous carbon layer 40 is formed on the second dielectric layer 30; a low-temperature oxide layer 41 is formed on the amorphous carbon layer 40; a second bottom anti-reflective layer 42 is formed on the low-temperature oxide layer 41; and a second patterned photoresist layer 43 is formed on the second bottom anti-reflective layer 42. The first patterned photoresist layer 43 may have an opening (not labeled). The opening may be disposed over a portion of the first dielectric layer 20 between the adjacent gate structures 13; and the width of the opening may be greater than the distance between the adjacent gate structures 13.

The amorphous carbon layer 40 may be formed by any appropriate process, such as a CVD process, or a PVD process, etc. The low-temperature oxide layer 41 may be made of any appropriate material, such as silicon oxide, or silicon oxynitride, etc. Various processes may be used to form the low-temperature oxide layer 41, such as a PVD process, or a plasma-enhanced CVD (PECVD) process, etc. The second bottom anti-reflective layer 42 may be made of any appropriate material, such as an organic material, etc. Various processes may be used to form the second bottom anti-reflective layer 42, such as a CVD process, or a spin-coating process, etc. The second patterned photoresist layer 43 may be formed by spin-coating a photoresist layer on the second bottom anti-reflective layer 42; and followed by an exposing and developing process.

Figure 9:
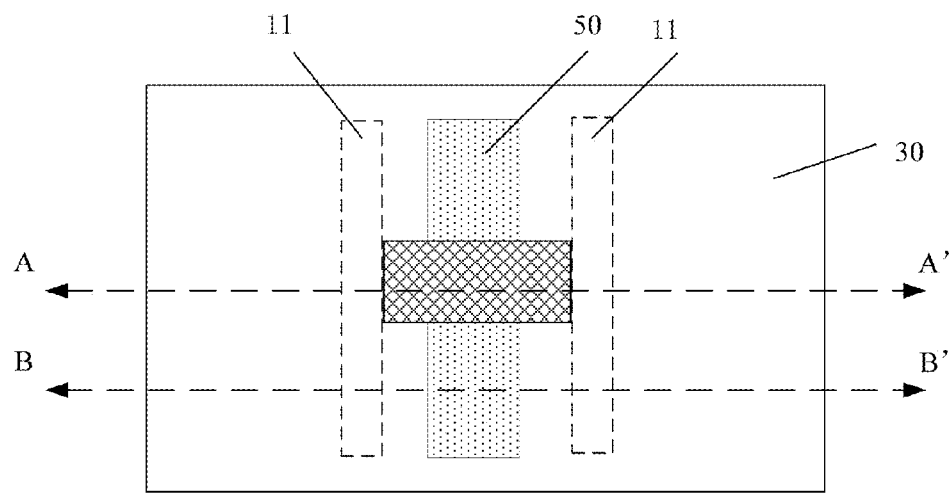
Figure 10:
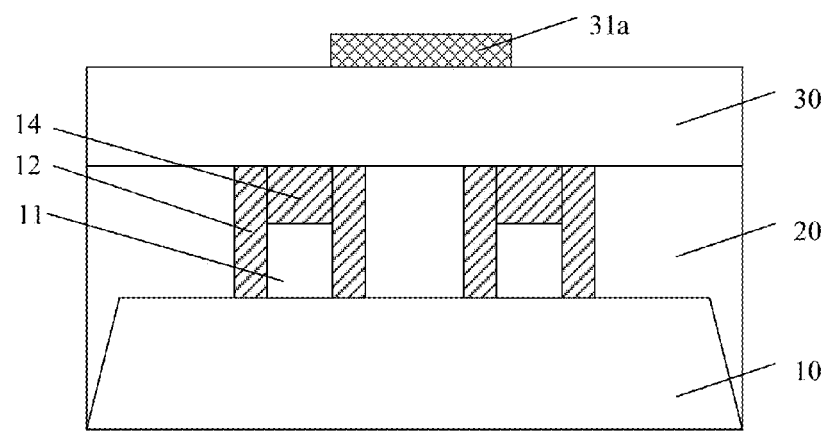

Returning to FIG. 26, after forming the second patterned photoresist layer 43, conductive vias may be formed (S108). FIG. 9 illustrates a top view of a corresponding semiconductor structure. FIG. 10 illustrates a cross-sectional view of the structure illustrated in FIG. 9 along the AA' direction; and FIG. 11 illustrates a cross-sectional view of the structure illustrated FIG. 9 along the BB' direction.

Figure 11:
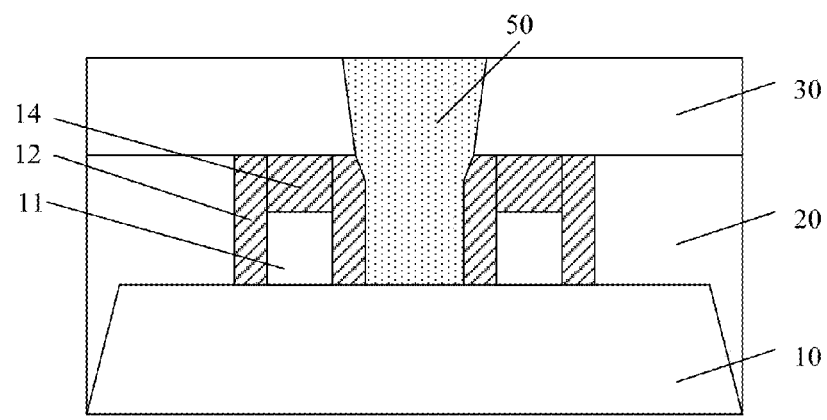

As shown in FIGS. 9~11, conductive vias 50 are formed on the semiconductor substrate 10 between the sidewall spacers 12 of adjacent gate structures 13. A process for forming the conductive vias 50 may include etching the second bottom anti-reflective layer 42, the low-temperature oxide layer 41 and the amorphous carbon layer 40 using the second patterned photoresist layer 43 as an etching mask to transfer the patterns of the second patterned photoresist layer 43 to the amorphous carbon layer 40; etching the second dielectric layer 30 and the first dielectric layer 20 until the surface of the semiconductor substrate 10 is exposed using the patterned amorphous carbon layer 40 as an etching mask to form through-holes (not labeled); and filling the contact through-holes with a metal material. The portion of the second dielectric layer 30 and the portion of the first dielectric layer 20 under the mask layer 31a may not be etched; and may be used as an insulation structure of adjacent conductive vias 50.

The second bottom anti-reflective layer 42, the low-temperature oxide layer 41 and the amorphous carbon layer 40 may be etched by any appropriate process, such as a dry etching process, or a wet etching process, etc. The second dielectric layer 30 and the first dielectric layer 20 may be etched by any appropriate process, such as a dry etching process, or a wet etching process, etc.

The conductive vias 50 may be made of any appropriate metal, such as Cu, Al, Ti, or W, etc. Various processes may be used to form the conductive vias 50, such as a PVD process, or a sputtering process, or an electroplating process, etc.

Thus, a semiconductor structure may be formed. As shown in FIGS. 9~11, the semiconductor structure may include a semiconductor substrate 10; and a plurality of gate structures 11 formed on the semiconductor substrate 10. Further, the semiconductor structure may also include a first dielectric layer 20 formed over the semiconductor substrate 10; and a protective layer 14 formed on the gate structures 11. Further, the semiconductor structure may also include sidewall spacers 12 formed on side surfaces of the gate structure 11 and the protective layer 14; and a second dielectric layer 20 formed on the first dielectric layer 20 and the protective layer 14. Further, the semiconductor structure may also include a mask layer 31a formed on the second dielectric layer 30 and contact vias 50 formed in the first dielectric layer 20 and the second dielectric layer 30.

Figure 27:
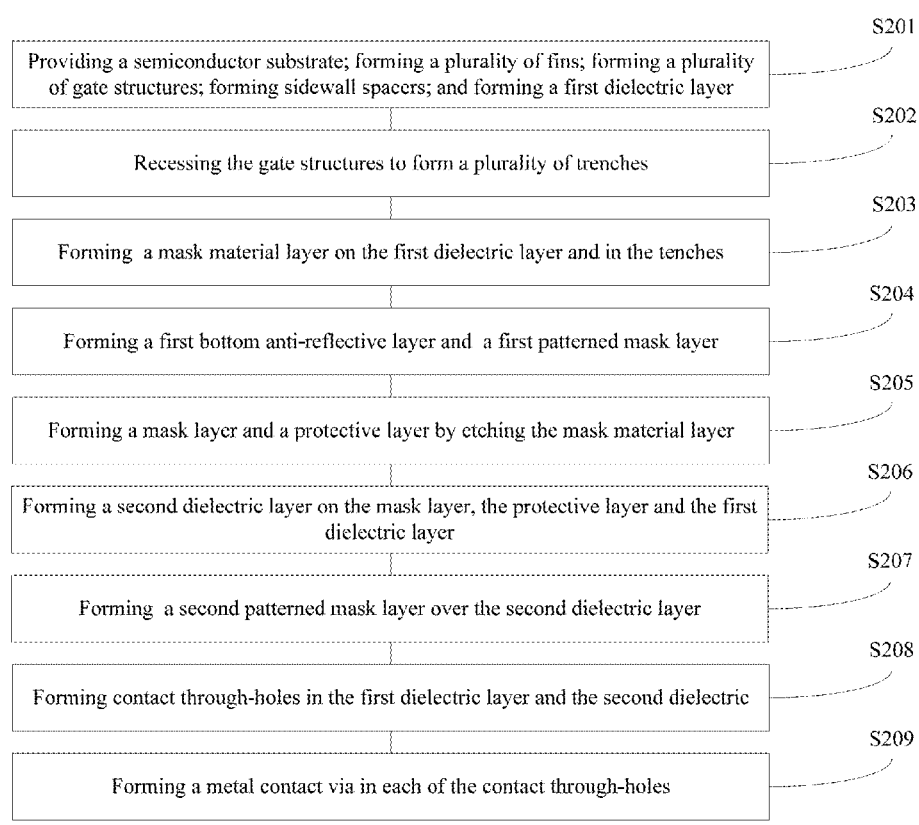
FIG. 27 illustrates another exemplary fabrication process of a semiconductor structure consistent with the disclosed embodiments

FIG. 27 illustrates another exemplary fabrication process of a semiconductor structure. FIGS. 12~25 illustrate semiconductor structures corresponding to certain stages of the exemplary process.

Figure 12:
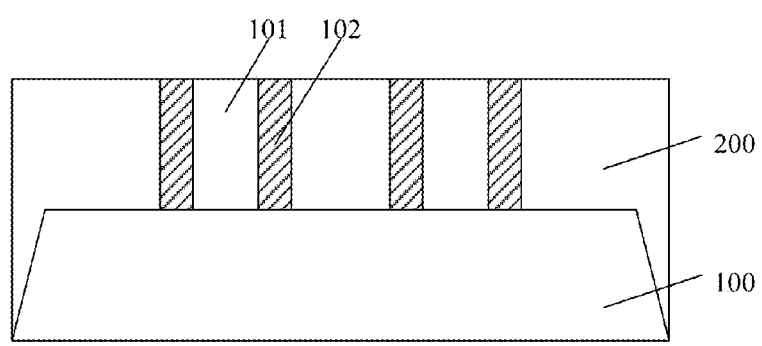
FIGS. 12~25 illustrate semiconductor structures corresponding to certain stages of another exemplary fabrication process of a semiconductor structure consistent with the disclosed embodiments.

As shown in FIG. 27, at the beginning of fabrication process, a semiconductor substrate with certain structures is provided (S201). FIG. 12 illustrates a corresponding semiconductor structure.

As shown in FIG. 12, a semiconductor substrate 100 is provided. A plurality of gate structures 101 may be formed on a surface of the semiconductor substrate 100; and sidewall spacers 102 may be formed on the side surfaces of the gate structures 101.

Further, a first dielectric layer 200 may be formed on the surface of the semiconductor substrate 100. The top surface of the first dielectric layer 200 may level with the top surfaces of the gate structures 101.

The semiconductor substrate 100 may be made of any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor or a combination thereof. In one embodiment, the semiconductor substrate 100 is single crystal silicon. The semiconductor substrate 100 provides a base for subsequent devices and processes.

A plurality of transistors may be formed on the semiconductor substrate 100. The transistors may be planar transistors, or FinFETs. The gate structures 101 may be the gate structures of the transistors.

In one embodiment, the transistors formed on the semiconductor substrate 100 are FinFETs. Specifically, the semiconductor substrate 100 may include a base substrate (not labeled) and a plurality of fins (not labeled) formed on a surface of the base substrate. The gate structures 101 may cross the fins; and may cover the top and side surfaces of the fins. The plurality of fins may be parallel. Shallow trench isolation (STI) structures may be formed in the semiconductor substrate 100 between adjacent fins to isolate the adjacent fins.

FIG. 12 illustrates a cross-sectional view of the semiconductor structure along a longitudinal direction of a fin. For illustrative purposes, two adjacent gate structures 101 are described. Self-aligned contact through-holes may be subsequently formed on the portion of the semiconductor substrate 100 between the adjacent gate structures 101.

In one embodiments, source and drain regions (not shown) may be formed in the semiconductor substrate 100 at both sides of the gate structures 101. The source and drain region formed in the semiconductor substrate 100 between adjacent gate structures 101 may be shared by the corresponding transistors having the gate structures 101.

Each of the plurality of gate structures 101 may include a gate dielectric layer (not shown) formed on the surface semiconductor substrate 100; and a gate (not labeled) formed on the gate dielectric layer. In certain other embodiments, a work function layer may be formed between the gate dielectric layer and the gate. The gate dielectric layer may be made of high dielectric constant (high-K) material, such as HfO, ZrO, AlO, or HfSiO, etc. The gate may be made of any appropriate material, such as W, Cu, Al, Au, Pt, Ti, or TiN, etc.

The sidewall spacers 102 may be used to protect the gate structures 101 during the subsequent processes. The sidewall spacers 102 may be made of any appropriate material, such as silicon nitride, silicon carbide, or silicon oxycarbide, etc. In one embodiment, the thickness of the sidewall spacers 102 may be in a range of approximately 50 Å~200 Å. Such a thickness may be enough to protect the gate structures 101 during the subsequent processes.

In one embodiment, after forming the gate structures 101 on the semiconductor substrate 100, the sidewall spacers 102 may be formed on the side surfaces of the gate structures 101. Then, an ion implantation process may be performed on the semiconductor substrate 100 at both sides of the gate structures 101 using the gate structures 101 and the sidewall spacers 101 as a mask to form the source and drain regions in the semiconductor substrate 100. Then, the first dielectric layer 200 may be formed on the surface of the semiconductor substrate 100. The top surface of the first dielectric layer 200 may level with the top surfaces of the gate structures 101.

The first dielectric layer 200 may be formed by forming a first dielectric material layer on the surfaces of the semiconductor substrate 100 and the gate structures 101; followed by planarizing the first dielectric material layer until the top surfaces of the gate structures 101 are exposed.

The first dielectric material layer may be made of any appropriate material, such as silicon oxide, or silicon oxynitride, etc. In one embodiment, the first dielectric material layer is made of silicon oxide. Various processes may be used to form the first dielectric layer 20, such as a chemical vapor deposition (CVD) process, a plasma-enhanced CVD (PECVD) process, a low-pressure CVD process, an atomic layer deposition (ALD) process, or a flowable CVD (FCVD) process, etc. The first dielectric material layer may be planarized by a chemical mechanical polishing (CMP) process to form the first dielectric layer 200.

Figure 13:
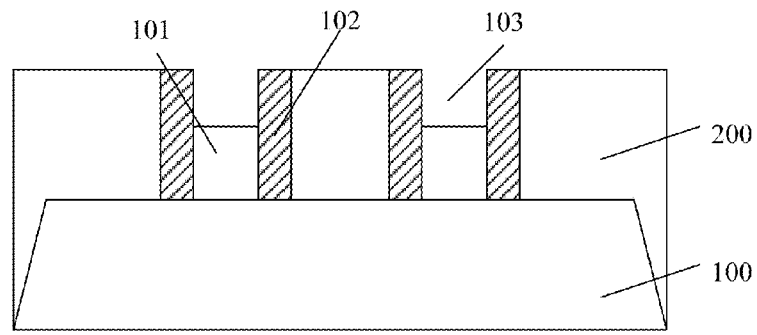

Returning to FIG. 27, after providing the semiconductor substrate 100 and forming the first dielectric layer 200, the gate structures 101 may be recessed to form trenches (S202). FIG. 13 illustrates a corresponding semiconductor structure.

As shown in FIG. 13, the gate structures 101 are recessed with a pre-determined depth; and a trench 103 may be formed on each of the plurality of the gate structures 101. That is, the top portions of the gate structures 101 may be removed; and the top surfaces of the remaining gate structures 101 may be lower than the top surface of the first dielectric layer 200. The gate structure 103 may include a gate dielectric layer and a gate. In one embodiment, the top portion of the gate may be removed to cause the height of the gate structures 103 to be reduced.

The gate structures 101 may be recessed by any appropriate process, such as a dry etching process, or a wet etching process, etc. In one embodiment, the gates are made of W, a dry etching process may be used to recess the gates. Specifically, the dry etching process is a plasma etching process. The etching gas may include $Cl_2$ and $CF_4$, etc. Such etching gases may have a relatively high etching selectivity to the gate material. The flow rate of $Cl_2$ may be in a range of approximately 10 sccm~100 sccm. The flow rate of $CF_4$ may be in a range of approximately 20 sccm~100 sccm. The pressure of the dry etching process may be in a range of approximately 10 mTorr~50 mTorr.

The trenches 103 may be used to subsequently form a protective layer and to protect the remaining gate structures 101 during the subsequent processes. The depth of the trenches 103 may not be substantially small. It may need to ensure the subsequently formed protective layer to have enough thickness to be able to protect the top surfaces of the remaining gate structures 103 during the subsequent process.

The depth of the trenches 103 may not be significantly large. If the depth of the trenches 103 is significantly large, the thickness of the remaining gate may be substantially small. Thus, the performance of the FinFETs may be affected. Further, if the depth of the trenches 103 is significantly large, the depth-to-width ratio of trenches 103 may be significantly large. The quality of the subsequently formed protective layer may be affected.

In one embodiment, the depth of the trenches 103 may be in a range of approximately 100 Å~700 Å. Such a depth range may ensure to subsequently form a relatively high quality protective layer in the trenches 103. Further, it may also cause the protective layer to have enough thickness such that the performance of the FinFETs may not be affected.

Figure 14:
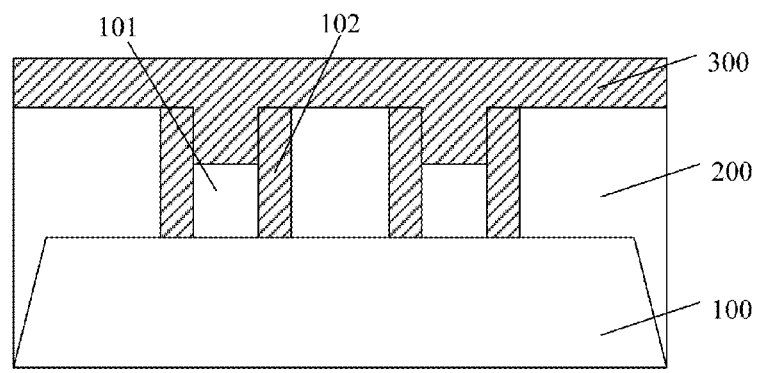

Returning to FIG. 27, after forming the trenches 103, a mask material layer may be formed (S203). FIG. 14 illustrates a corresponding semiconductor structure.

As shown in FIG. 14, a mask material layer 300 is formed. The mask material layer 300 may cover the surface of the first dielectric layer 200; and fill the trenches 103. The mask material layer 300 may be used to subsequently form a mask layer and a protective layer.

The mask material layer 300 may be made of a material different from the first dielectric layer 200; and the mask material layer 300 and the first dielectric layer 200 may have a significantly high etching selectivity. When the contact through-holes are subsequently formed by etching the first dielectric layer 200, the mask layer and the protective layer formed from the mask material layer 300 may not be damaged.

The mask material layer 300 may be made of any appropriate material, such as silicon nitride, silicon oxynitride, silicon carbide, or silicon oxycarbide, etc. In one embodiment, the mask material layer 300 is made of silicon nitride;

and the first dielectric layer 200 is made of silicon oxide. Silicon nitride and silicon oxide may have a relatively high etching selectivity.

A portion of the mask material layer 300 may be on the surface of the first dielectric layer 200, and a portion of the mask layer 300 may be in the trenches 103. The portion of the mask material layer 300 in the trenches 103 may be used to subsequently form a protective layer on the remaining gate structures 101.

The portion of the mask material layer 300 on the surface of the first dielectric layer 200 may be used to subsequently form a mask layer for subsequently forming contact through-holes in the first dielectric layer 200. The thickness of the portion of the mask material layer 300 on the surface of the first dielectric layer 200 may be in a range of approximately 100 Å~700 Å. Based on such a thickness, the thickness of the subsequently formed mask layer may be in a range of approximately 100 Å~700 Å. Such a thickness may be enough to prevent the subsequently formed mask layer from being consumed up during the process for etching the first dielectric layer 200 to form contact through-holes.

Although the mask material layer 300 and the first dielectric layer 200 may have a relatively high etching selectivity, the mask layer formed from the mask material layer 300 may still be consumed during the subsequent etching process. Further, the first dielectric layer 200 may be relatively thick, it may take a relatively long time to etch through the first dielectric layer 200. If the thickness of the mask layer is relatively small, the mask layer may be entirely consumed before etching through the first dielectric layer 200 to form the contact through-holes. Thus, the size and the morphology of the final contact through-holes may be affected.

In one embodiment, after forming a mask material, the mask material may be planarized to form the mask material layer 300 with a flat surface. The mask material may be planarized by any appropriate process, such as a CVD process, or a dry etching process, etc.

In certain other embodiments, the mask material may not be planarized. The mask material may be directly used as the mask material layer 300.

Figure 15:
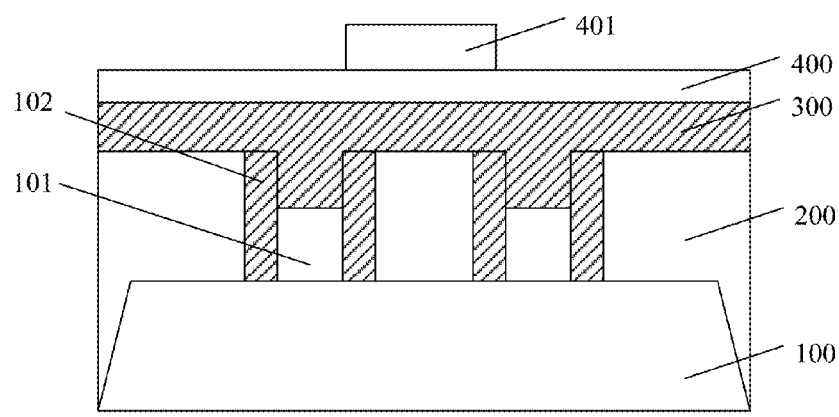

Returning to FIG. 27, after forming the mask material layer 300, a first bottom reflective layer and a first patterned photoresist layer may be formed (S204). FIG. 15 illustrates a corresponding semiconductor structure.

As shown in FIG. 15, a first bottom anti-reflective layer 400 is formed on the mask material layer 300. Further, a first patterned photoresist layer 401 is formed on the first bottom anti-reflective layer 400.

The first bottom anti-reflective layer 400 may be made of an anti-reflective material that is able to effectively delaminate the standing wave caused by a reflection during a photolithography process. The bottom anti-reflective material may also be able to increase the energy range and the focus distance during the photolithography process; and reduce the pattern notches caused by the diffraction of the reflective light. Thus, desired photolithographic patterns with a relative small critical dimension may be obtained.

The first bottom anti-reflective layer 400 may be formed by any appropriate process. In one embodiment, the first bottom anti-reflective layer 400 is formed by a spin-coating process.

After forming the first bottom anti-reflective layer 400, a photoresist layer may be formed on the first bottom anti-reflective layer 400. Then, an exposure and developing process may be performed onto the photoresist layer; and the first patterned photoresist layer 401 may be formed. The first patterned photoresist layer 401 may define the position and size of the subsequently formed mask layer.

In one embodiment, the first patterned photoresist layer 401 may be formed above a portion of the first dielectric layer 200 between adjacent gate structures 101. Further, the first patterned photoresist layer 401 may cross over the adjacent gate structures 101. The first patterned photoresist layer 401 may be parallel with the surface of the semiconductor substrate 100; and the size of the first patterned photoresist layer 401 along the cross-section of the semiconductor substrate 100 may be greater than the distance between the adjacent gate structures 101.

In certain other embodiments, the first patterned photoresist layer 401 may be formed on the mask material layer 300 directly. In still certain other embodiments, before forming the first bottom anti-reflective layer 400, an amorphous carbon layer may be formed on the mask material layer 300; and a low-temperature oxide layer may be formed on the amorphous carbon layer by multiple exposure processes. Such layers may improve the accuracy of the pattern transfer when the first patterned mask layer 401 is subsequently used as an etching mask.

Figure 16:
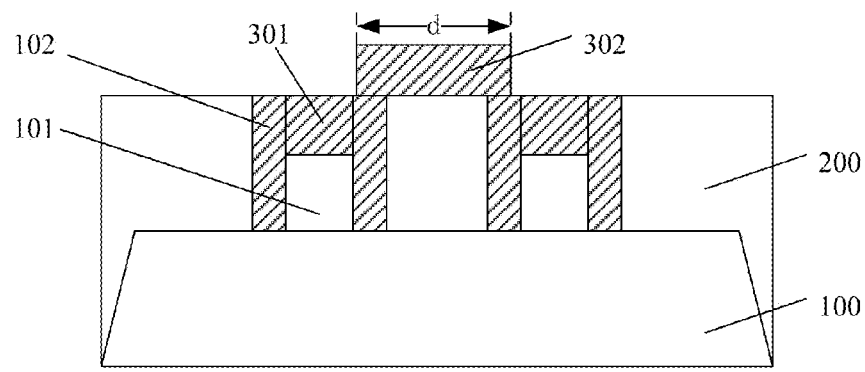

Returning to FIG. 27, after forming the first patterned photoresist layer 401, a mask layer and a protective layer may be formed (S205). FIG. 16 illustrates a corresponding semiconductor structure.

As shown in FIG. 16, a protective layer 301 is formed; and the protective layer 301 may fill the trenches 103. Further, a mask layer 302 is formed on a portion of the first dielectric layer 200 between adjacent gate structures 101. The protective layer 301 and the mask layer 302 may be formed by etching the first bottom anti-reflective layer 400 and the mask material layer 300 using the first patterned photoresist layer 401 as an etching mask. After forming the mask layer 302 and the protective layer 301, the first patterned photoresist layer 401 and the first bottom anti-reflective layer 400 may be removed. The width "d" of the mask layer 302 may be greater than the distance between adjacent gate structures 101; and the mask layer 302 may cross over the portion of the first dielectric layer 200 between adjacent gate structures 101.

The protective layer 301 may be used to protect the gate structures 101 during subsequent processes. The width "d" of the mask layer 302 may be greater than the width of the portion of the first dielectric layer 200 between adjacent gate structures 101. The mask layer 302 may cross over the portion of the first dielectric layer 200 between adjacent gate structures 101; and expose portions of the first dielectric layer 200 between the adjacent gate structures 101 at both sides of the mask layer 302. The exposed portions of the first dielectric layer 200 may be subsequently etched to form contact through-holes at both sides of the mask layer 302. The non-etched portion of the first dielectric layer 200 under the mask layer 302 may be used as an insulation structure between the contact through-holes.

Further, in one embodiment, the mask layer 302 may cover the portions of the first dielectric layer 200 between adjacent gate structures 101 and portions of the sidewall spacers 102. In certain other embodiments, the mask layer 302 may also cover portions of the protective layer 301.

The first bottom anti-reflective layer 400 and the mask material layer 300 may be etched by any appropriate process, such as a dry etching process, or a wet etching process. In one embodiment, the first bottom anti-reflective layer 400 and the mask material layer 300 are etched by a dry etching process. The etching gas of the dry etching process may include one or more of $CF_4$, $SF_6$, $CHF_3$, and $C_2H_2F_4$, etc.

The first dielectric layer 200 may be used as an etching stop layer. The first patterned photoresist layer 401 and the first bottom anti-reflective layer 400 may be removed by any appropriate process, such as a dry etching process, a wet etching process, or a plasma ashing process, etc.

Figure 17:
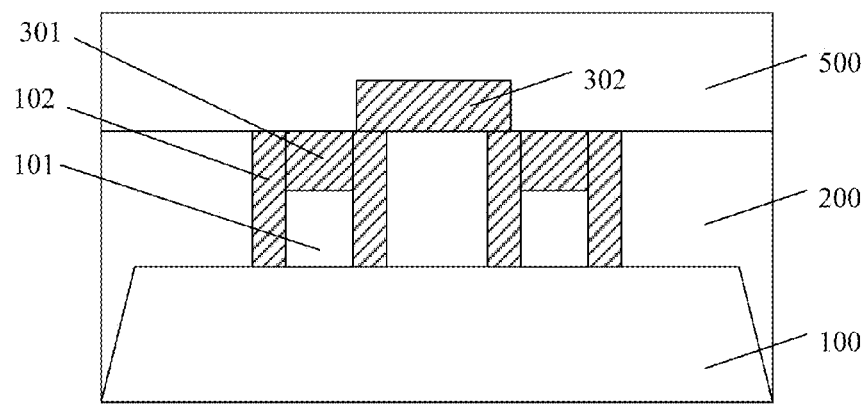

Returning to FIG. 27, after forming the mask layer 302 and the protective layer 301, a second dielectric layer may be formed (S206). FIG. 17 illustrates a corresponding semiconductor structure.

As shown in FIG. 17, a second dielectric layer 500 is formed. The second dielectric layer may cover the first dielectric layer 200, the mask layer 302, the protective layer 301 and the sidewall spacers 102. A process for forming the second dielectric layer 500 may include forming a second dielectric layer material layer to cover the first dielectric layer 200, the mask layer 302, the protective layer 301 and the sidewall spacers 102; and followed by planarizing the second dielectric material layer. Thus, the second dielectric layer 500 with a flat surface may be formed.

The second dielectric layer 500 may be made of any appropriate material, such as silicon oxide, or silicon oxynitride, etc. In one embodiment, the second dielectric layer 500 is made of silicon oxide. The second dielectric layer 500 may be made of a same material with that of the first dielectric layer 200. Thus, a same etching process may be subsequently used to etch the first dielectric layer 200 and the second dielectric layer 500 to form contact through-holes. In certain other embodiments, the second dielectric layer 500 may be made of low-K material. The low-K material may reduce the parasitic capacitance of the semiconductor structures. Various processes may be used to form the second dielectric layer 500, such as a CVD process, a PVD process, a PECVD process, or a LPCVD process, etc.

Referring to FIGS. 16~17, because the mask layer 302 may be higher than the surface of the first dielectric layer 200, the portion of the second dielectric material layer on the mask layer 302 may also be higher than other portions of the second dielectric material layer. Therefore, it may need a planarization process to cause the second dielectric layer 500 to have an uniform height at different positions. The uniform height at different positions may facilitate the subsequently formed contact through-holes to have an uniform depth at different positions.

The second dielectric material may be planarized by any appropriate process, such as a CMP process, a dry etching process, or a wet etching process, etc. In one embodiment, a CMP process is used to planarize the second dielectric material layer to form the second dielectric layer 500.

Figure 18:
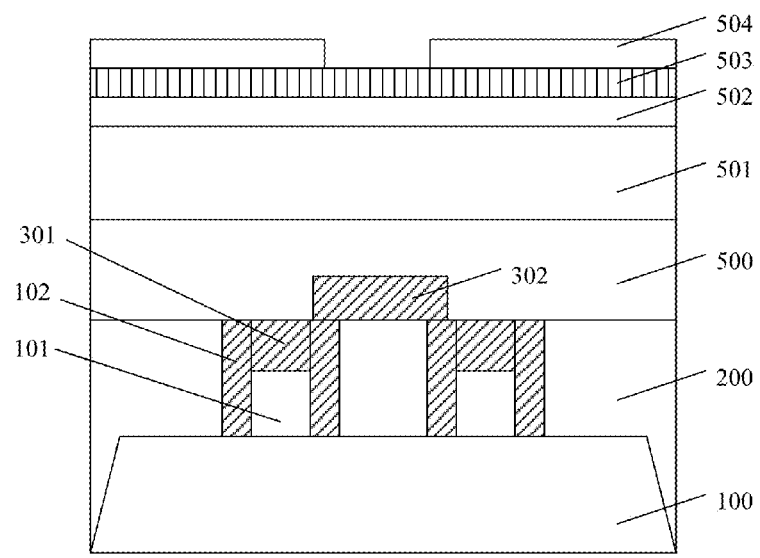
Figure 19:
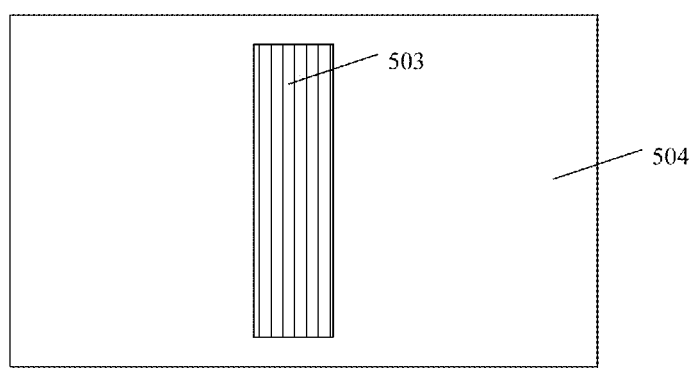

Returning to FIG. 27, after forming the second dielectric layer 500, a second patterned mask layer may be formed (S207). FIGS. 18~19 illustrates a corresponding semiconductor structure. FIG. 19 is a top view of the structure illustrated in FIG. 18.

As shown in FIGS. 18~19, a second patterned mask layer 504 is formed. Before forming the second patterned mask layer 504, a second amorphous carbon layer 501 may be formed on the second dielectric layer 500; a second low-temperature oxide layer 502 may be formed on the second amorphous carbon layer 501; and a second bottom-reflective layer 503 may be formed on the second low-temperature oxide layer 502.

The second patterned mask layer 504 may have an opening (not labeled). The opening may be over the portion of the first dielectric layer 200 between adjacent gate structures 101. The width of the opening may be greater than the width of the portion of the first dielectric layer 200 between adjacent gate structures 101.

The second patterned mask layer 504 may be a patterned photoresist layer, or a patterned hard mask layer, etc. In one embodiment, the second patterned mask layer 504 is a patterned photoresist layer.

The patterns on the second patterned photoresist layer 504 may be subsequently transferred to the second amorphous carbon layer 501 by etching the second bottom anti-reflective layer 503, the second low-temperature oxide layer 502 and the second amorphous carbon layer 501 using the second patterned photoresist layer 504 as an etching mask. Then, the patterned amorphous carbon layer 501 may be used as an etching mask to etch the second dielectric layer 500 and the first dielectric layer 200 to form contact through-holes.

The thickness of the second amorphous carbon layer 501 may be relatively large, and the anti-etching ability of the second amorphous carbon layer 501 may be relatively strong. Thus, the second amorphous carbon layer 501 may not be entirely consumed during the subsequent etching processes for forming contact through-holes. Further, because the thickness of the second dielectric layer 500 may be relatively large, if only the second patterned photoresist layer 504 is used to etch the second dielectric layer 500 and the first dielectric layer 200 to form the contact through-holes, it may be easy to entirely consume the second patterned photoresist layer 504 before the contact through-holes are entirely formed. Accordingly, the size and morphology of the final contact through-holes may be affected; and the performance of the semiconductor structure may be affected.

Figure 20:
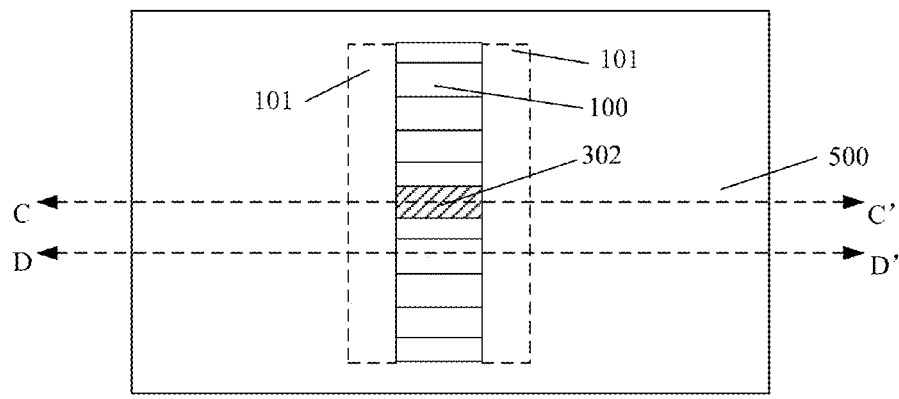
Figure 21:
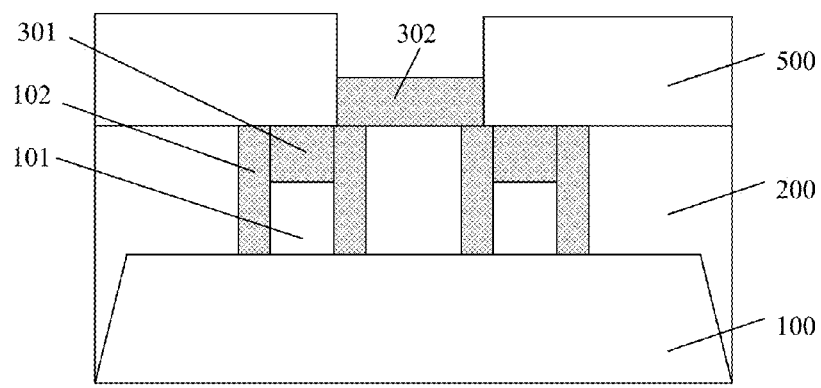

Returning to FIG. 27, after forming the second patterned photoresist layer 504, contact through-holes may be formed (S208). FIG. 20 illustrates a top view of a corresponding semiconductor structure. FIG. 21 illustrates a cross-sectional view of the structure illustrated in FIG. 20 along the CC' direction; and FIG. 22 illustrates a cross-sectional view of the structure illustrated FIG. 20 along the DD' direction.

Figure 22:
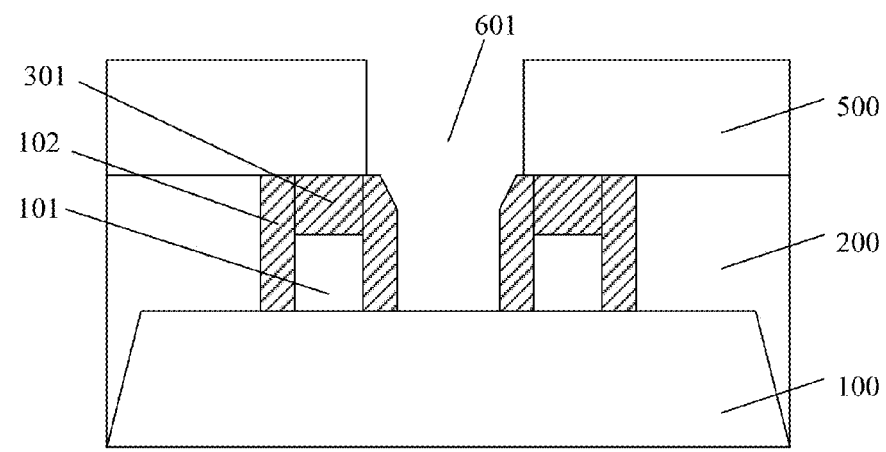

As shown in FIGS. 20~22, contact through-holes 601 are formed in the second dielectric layer 500 and the first dielectric layer 200. The contact through holes 601 may be formed on portions of first dielectric layer 200 between adjacent sidewall spacers 102 at both sides of the mask layer 302.

The contact through-holes 601 may be formed by etching the second bottom anti-reflective layer 503, the second low temperature oxide layer 502 and the second amorphous carbon layer 501 to expose the surface of the second dielectric layer 500 using the second patterned photoresist layer 504 as an etching mask. Then, the second dielectric layer 500 and the first dielectric layer 200 may be etched until the surface of the semiconductor substrate 100 is exposed. Thus, the contact through-holes 601 may be formed. After forming the contact through-holes 601, the second patterned photoresist layer 504, the second bottom anti-reflective layer 503, the second low-temperature oxide layer 502 and the second amorphous carbon layer 501 may be removed.

Specifically, the second bottom anti-reflective layer 503, the second low temperature oxide layer 502 and the second amorphous carbon layer 501 may be sequentially etched to transfer the patterns on the second patterned photoresist layer 504 to the second amorphous carbon layer 501. Then, the second dielectric layer 500 and the first dielectric layer 200 may be etched. When the second dielectric layer 500 is etched to the depth reaching the mask layer 302, because the mask layer 302 may have significantly high etching selectivity with the second dielectric layer 500, the second dielectric layer 500 at both sides of the mask layer 302 may continue to be etched to the first dielectric layer 200. Then, the first dielectric layer 200 bellow both sides the mask layer 302 may continue to be etched until the surface of the semiconductor substrate 100 is exposed. Thus, the contact through-holes 601 may be formed. In one embodiment, the contact through-holes 601 may expose the top surfaces of the fins formed on the semiconductor substrate 100.

The mask layer 302 may be used as an etching stop layer. The mask layer 302 may also be used as an etching mask for forming the contact through-holes 601 to prevent the portion of first dielectric layer 200 under the mask layer 302 from being etched. Thus, the contact through-holes 601 may be insulated by the portion of the first dielectric layer 200 under the mask layer 302.

During the process for forming the contact through-holes 601, the sidewall spacers 102 may protect the side surfaces of the gate structures 101; and the protective layer 301 may protect the top surfaces of the gate structures 101. Thus, the gate structures 103 may not be exposed.

The second bottom anti-reflective layer 503, the second low-temperature oxide layer 502, the second amorphous carbon layer 501, the second dielectric layer 500 and the first dielectric layer 200 may be etched by any appropriate process, such as a dry etching process, or a wet etching process, etc. In one embodiment, the second bottom anti-reflective layer 503, the second low-temperature oxide layer 502, the second amorphous carbon layer 501, the second dielectric layer 500 and the first dielectric layer 200 are etched by a dry etching process. The etching gas of the dry etching process may include $CF_4$, etc. The buffer gas of the etching gas may be He, etc. The pressure of the dry etching process may be in a range of approximately 20 mTorr~200 mTorr. The flow rate of $CF_4$ may be in a range of approximately 50 sccm~1000 sccm. The flow rate of He may be in a range of approximately 50 sccm~1000 scmm. In certain other embodiments, the etching gas may include one or more of $CF_4$, $CHF_3$, and $C_2F_6$, etc.

The second bottom anti-reflective layer 503, the second low-temperature oxide layer 502 and the second amorphous carbon layer 501 may be removed by any appropriate process, such as a dry etching process, a wet etching process, or a plasma ashing process, etc.

Figure 23:
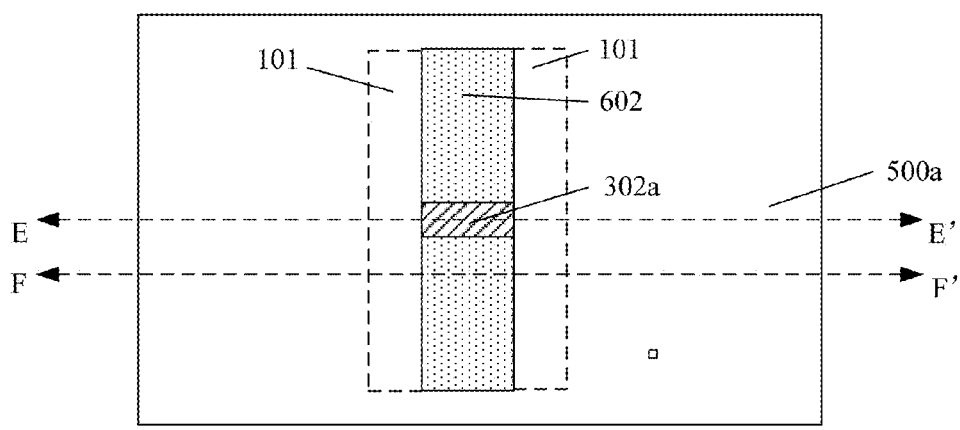
Figure 24:
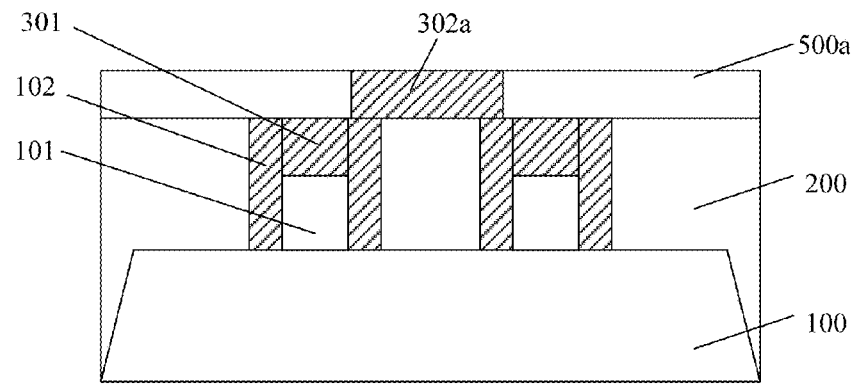

Returning to FIG. 27, after forming the contact through-holes 601, metal contact vias may be formed (S209). FIG. 23 illustrates a top view of a corresponding semiconductor structure. FIG. 24 illustrates a cross-sectional view of the structure illustrated in FIG. 22 along the EE' direction; and FIG. 25 illustrates a cross-sectional view of the structure illustrated FIG. 22 along the FF' direction.

Figure 25:
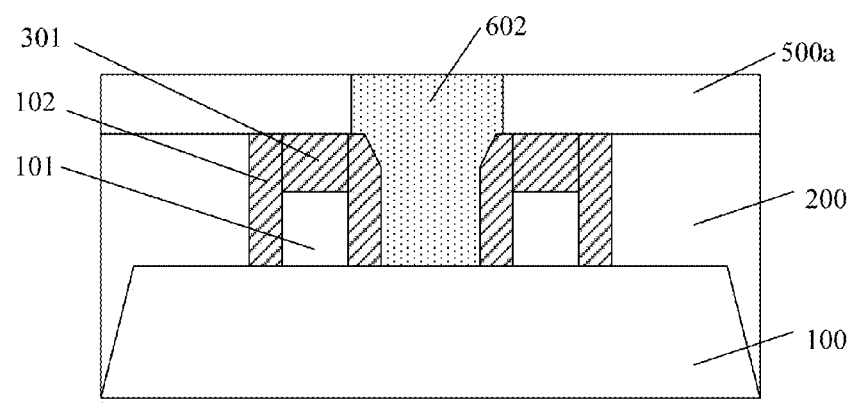

As shown in FIGS. 23~25, a metal contact via 602 is formed in each of the contact through-holes 601. The metal contact vias 602 may electrically contact with the surface of the fins exposed by the contact through-holes 601. Further, the second dielectric layer 500 may be thinned to form a planarized second dielectric layer 500a.

The process for forming the metal contact vias 602 may include forming a metal material layer in the contact through-holes 601 and on the surface of the second dielectric layer 500; followed by planarizing the metal material layer until the surface of the second dielectric layer 500 is exposed. To ensure the metal contact vias 602 at both sides of the mask layer 302 to be entirely separated, the planarization process may be stopped at a position lower than the initial surface of the mask layer 302. Thus, the planarized mask layer 302a and the planarized second dielectric layer 500a may be formed. That is, the thickness of the planarized mask layer 302a may be smaller than that of the initial mask layer 302; and the thickness of the planarized second dielectric layer 500a may be smaller than that of the initial second dielectric layer 500. In one embodiment, the planarization process may be stopped at the position bellow the mask layer 302 in a range of approximately 50 Å~100 Å. Such a position may ensure the metal conductive vias 602 at both sides of the mask layer 302 to be entirely insulated.

The metal conductive vias 602 may be made of any appropriate metal, such as W, Cu, Al, Ag, or Cu, etc. In one embodiment, the metal conducive vias 602 are made of W. Various processes may be used to form the metal material layer, such as a PVD process, or a sputtering process, or an electroplating process, etc. The metal material layer may be planarized by a CMP process.

Thus, a semiconductor structure may be formed by the above disclosed processes and methods; and the corresponding semiconductor structure is illustrated in FIGS. 23~25. As shown in FIGS. 23~25, the semiconductor structure includes a semiconductor substrate 100 having a plurality of fins; and a plurality of gate structures 101 formed on the fins. The semiconductor structure also includes a protective layer 301 formed on the top surfaces of the gate structures 101, and sidewall spacers 102 formed on side surfaces of the gate structures 101 and the protective layer 301. Further, the semiconductor structure includes a first dielectric layer 200 formed on the surface of the semiconductor substrate 100 and covering the fins and the side surfaces of the sidewall spacers 102; and a mask layer 302a formed on the portion of the first dielectric layer 200 between adjacent gate structures 101. Further, the semiconductor structure also includes a second dielectric layer 500a formed on the first dielectric layer 200, the protective layer 301 and the sidewall spacers 102 and covering the side surfaces of the mask layer 302a. Further, the semiconductor structure also includes metal conductive vias 602 formed in the first dielectric layer 200 between the adjacent gate structures 101 and at both sides of the mask layer 302a. The detailed structures and intermediate structures are described above with respect to the fabrication processes.

According to the disclosed methods and structures, the mask layer for forming contact through-holes and the protective layer on the top surfaces of the gate structures may be formed by etching a mask material layer formed on the first dielectric layer. During the fabrication of contact through-holes, the protective layer may protect the top surfaces of the gate structures; the sidewall spacers may protect the side surfaces of the gate structures; and the mask layer may be used as an etching mask to form the contact through-holes. Thus, a portion of the first dielectric layer under the mask layer may not be etched; and may be used as an insulation structure between the contact through-holes.

Further, the distance between the mask layer and the semiconductor substrate may be relatively small. Thus, the size accuracy of the final contact through-holes may be improved; and the performance of the semiconductor structure may be enhanced. Further, the mask layer may be made of silicon nitride, silicon oxynitride, silicon carbide, or silicon oxycarbide, etc. Thus, the metal contamination for forming the contact through-holes may be avoided.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:
1. A method for fabricating a semiconductor structure, comprising:
provinding a semiconductor substrate;
forming a plurality of gate structures and sidewall spacers on side surfaces of the gate structures;
forming a first dielectric layer on the semiconductor substrate;
recessing the gate structures to form a plurality of trenches on top surfaces of the gate structures;
forming a protective layer on the top surfaces of the remaining gate structures;
forming a mask layer over a portion of the first dielectric layer between two adjacent gate structures, wherein a width of the mask layer is greater than a distance between the two adjacent gate structures;
forming two contact through-holes in the first dielectric layer between the two adjacent gate structures at both sides of the mask layer, wherein the two contact through-holes are separated by the portion of the first dielectric layer covered by the mask layer and are arranged in a direction perpendicular to a direction of the two gate structures from a top view; and
forming a metal contact via in each of the two contact through-holes, the two metal contact vias at both sides of the mask layer being separated by the portion of the first dielectric layer covered by the mask layer.

2. The method according to claim 1, wherein:
a top surface of the first dielectric layer levels with top surfaces of the gate structures; and
the mask layer crosses over the portion of the first dielectric layer between the adjacent gate structures.

3. The method according to claim 1, wherein:
the gate structures are recessed by a dry etching process.

4. The method according to claim 1, wherein:
a depth of the trenches is in a range of approximately 100 Å~700 Å.

5. The method according to claim 1, wherein the width of the mask layer is greater than a distance between adjacent sidewall spacers of the two adjacent gate structures.

6. The method according to claim 1, wherein forming the protect layer and the mask layer further comprises:
forming a mask material layer filling the trenches and on the first dielectric layer;
forming a first bottom anti-reflective layer on the mask material layer;
forming a first patterned mask layer on the first bottom anti-reflective layer; and
etching the first bottom anti-reflective layer and the mask material layer using the first patterned mask layer as an etching mask.

7. The method according to claim 6, after forming the mask material layer, further comprising:
planarizing the mask material layer.

8. A method for fabricating a semiconductor structure, comprising:
providing a semiconductor substrate;
forming a plurality of gate structures and sidewall spacers on side surfaces of the gate structures;
forming a first dielectric layer on the semiconductor substrate;
recessing the gate structures to form a plurality of trenches on top surfaces of the gate structures;
forming a protective layer on the top surfaces of the remaining gate structures;
forming a mask layer over a portion of the first dielectric layer between two adjacent gate structures, wherein a width of the mask layer is greater than a distance between the two adjacent gate structures;
forming a plurality of contact through-holes in the first dielectric layer between the two adjacent gate structures at both sides of the mask layer,
wherein forming contact through-holes further comprises:
forming a second dielectric layer to cover the first dielectric layer, the mask layer, and the protective layer and the sidewall spacers;
forming a second patterned photoresist layer with a plurality of openings over the portion of the first dielectric layer between the adjacent gate structures over the second dielectric layer, wherein a width of the plurality of openings is greater than the distance between the two adjacent gate structures; and
etching the second dielectric and the first dielectric layer using the second patterned photoresist layer as an etching mask until the surface of the semiconductor substrate is exposed,
wherein the plurality of contact through-holes are separated by the portion of the first dielectric layer covered by the mask layer and are arranged parallel to the gate structures; and
forming a metal contact via in each of the plurality of contact through-holes.

9. The method according to claim 8, before forming the second patterned photoresist layer, further comprising:
forming an amorphous carbon layer on the second dielectric layer;
forming a low-temperature oxide layer on the amorphous carbon layer; and
forming a second bottom anti-reflective layer on the low-temperature oxide layer.

10. The method according to claim 8, wherein forming the second dielectric layer further comprises:
planarizing the second dielectric material layer.

11. The method according to claim 10, wherein:
the second dielectric material layer is planarized by one of a chemical mechanical polishing process, a dry etching process, and a wet etching process.

12. The method according to claim 8, wherein forming the metal conductive vias further comprises:
forming a metal material layer filling in the contact through-holes and covering the second dielectric layer; and
planarizing the metal material layer until a top surface of the second dielectric material layer is exposed.

13. The method according to claim 12, further comprising:
planarizing the metal material layer and the second dielectric layer to cause the planarization process to stop at a position below an original top surface of the mask layer.

14. The method according to claim 13, wherein:
a stop position of the planarization process is lower than the original top surface of the mask layer in a range of approximately 50 Å~100 Å.

15. A method for fabricating a semiconductor structure, comprising:
providing a semiconductor substrate;

forming a plurality of gate structures and sidewall spacers on side surfaces of the gate structures;

forming a first dielectric layer on the semiconductor substrate;

recessing the gate structures to form a plurality of trenches on top surfaces of the gate structures;

forming a protective layer on the top surfaces of the remaining gate structures;

forming a second dielectric layer on the first dielectric layer and the protective layer;

forming a mask layer on the second dielectric layer and over a portion of the first dielectric layer between two adjacent gate structures, wherein a width of the mask layer is greater than a distance between the two adjacent gate structures;

forming two contact through-holes in the first dielectric layer and the second dielectric layer between the two adjacent gate structures at both sides of the mask layer, wherein the two contact through-holes are separated by the portion of the first dielectric layer covered by the mask layer and are arranged in a direction perpendicular to a direction of the two gate structures from a top view; and forming a metal contact via in each of the two contact through-holes, the two metal contact vias at both sides of the mask layer being separated by the portion of the first dielectric layer covered by the mask layer.

16. The method according to claim 15, wherein the width of the mask layer is greater than a distance between adjacent sidewall spacers of the two adjacent gate structures.

17. The method according to claim 15, wherein forming the mask layer further comprises:

forming a mask material layer on the second dielectric layer;

forming a first bottom anti-reflective layer on the mask material layer;

forming a first patterned mask layer on the first bottom anti-reflective layer; and etching the first bottom anti-reflective layer and the mask material layer using the first patterned mask layer as an etching mask.

18. The method according to claim 17, wherein forming the contact through-holes further comprises:

forming a second patterned photoresist layer with a plurality of openings between the two adjacent gate structures at both sides of the mask layer, wherein a width of the plurality of openings is greater than the distance between the two adjacent gate structures; and etching the second dielectric and the first dielectric layer using the second patterned photoresist layer as an etching mask until the surface of the semiconductor substrate is exposed.

19. The method according to claim 18, wherein forming the second patterned photoresist layer further comprises:

forming an amorphous carbon layer on the mask layer and the second dielectric layer;

forming a low-temperature oxide layer on the amorphous carbon layer; and forming a second bottom anti-reflective layer on the low-temperature oxide layer.

\* \* \* \* \*